(12) United States Patent
Xu et al.

(10) Patent No.: US 12,688,995 B2
(45) Date of Patent: Jul. 21, 2026

(54) METHOD OF PROCESSING ION BEAM BASED ON OPTICAL MICROSCOPY IMAGING

(71) Applicant: INSTITUTE OF BIOPHYSICS, CHINESE ACADEMY OF SCIENCES, Beijing (CN)

(72) Inventors: Tao Xu, Beijing (CN); Wei Ji, Beijing (CN); Weixing Li, Beijing (CN); Jing Lu, Beijing (CN); Ke Xiao, Beijing (CN)

(73) Assignee: Institute of Biophysics, Chinese Academy of Sciences, Beijing (CN)

( * ) Notice: Subject to any disclaimer, the term of this patent is extended or adjusted under 35 U.S.C. 154(b) by 440 days.

(21) Appl. No.: 18/334,995

(22) Filed: Jun. 14, 2023

(65) Prior Publication Data

US 2024/0112880 A1 Apr. 4, 2024

(30) Foreign Application Priority Data

Sep. 30, 2022 (CN) .......................... 202211206312.9

(51) Int. Cl.
H01J 37/22 (2006.01)

(52) U.S. Cl.
CPC ..... H01J 37/222 (2013.01); H01J 2237/2067 (2013.01)

(58) Field of Classification Search
CPC ........................ H01J 37/222; H01J 2237/2067
See application file for complete search history.

(56) References Cited

U.S. PATENT DOCUMENTS 8,754,384 B1 6/2014 Persoon et al.
9,741,532 B1 8/2017 Bedell et al.
(Continued)

FOREIGN PATENT DOCUMENTS

CN 103308496 9/2013
CN 104142302 11/2014
(Continued)

OTHER PUBLICATIONS

Li et al. "Integrated multimodality microscope for accurate and efficient target-guided cryo-lamellae preparation", https://www.nature.com/articles/s41592-022-01749-z (Year: 2023).*

(Continued)

*Primary Examiner* — Georgia Y Epps
*Assistant Examiner* — Hanway Chang
(74) *Attorney, Agent, or Firm* — Knobbe, Martens, Olson & Bear, LLP

(57) ABSTRACT

Provided is a method of ion beam processing based on optical microscopy imaging, including: marking a surface of a sample using the ion beam, so as obtain a registration reference pattern; performing a three-dimensional optical imaging on the sample to obtain a first three-dimensional light microscopy image; projecting the first three-dimensional light microscopy image to a cutting angle of the ion beam, and determining a first position of a to-be-researched target in the first three-dimensional light microscopy image based on the registration reference pattern; performing an ion beam imaging on the sample to obtain an image excited by the ion beam, and determining, according to the first position, a second position of the to-be-researched target in the image excited by the ion beam; and thinning the sample according to the second position to obtain a first slice containing the to-be-researched target.

13 Claims, 8 Drawing Sheets

(56) References Cited

U.S. PATENT DOCUMENTS

| | | | |
|---|---|---|---|
| 2008/0029714 | A1 | 2/2008 | Olsen et al. |
| 2019/0057522 | A1 | 2/2019 | Uetake et al. |
| 2019/0348253 | A1 | 11/2019 | Konyuba et al. |
| 2020/0266026 | A1 | 8/2020 | Haruta et al. |
| 2021/0104375 | A1 | 4/2021 | Geurts et al. |

FOREIGN PATENT DOCUMENTS

| | | |
|---|---|---|
| CN | 104198242 | 12/2014 |
| CN | 104215580 | 12/2014 |
| CN | 108956562 | 12/2018 |
| CN | 110057851 | 7/2019 |
| CN | 110108690 | 8/2019 |
| CN | 111292310 | 6/2020 |
| CN | 111413356 | 7/2020 |
| CN | 113358611 | 9/2021 |
| CN | 113358611 A | 9/2021 |
| CN | 113670956 | 11/2021 |
| JP | 09-283073 A | 10/1997 |
| JP | 2000-97823 A | 4/2000 |
| JP | 2012-016802 A | 1/2012 |
| JP | 2022-136554 A | 9/2022 |
| WO | WO 2021/239979 | 12/2021 |

OTHER PUBLICATIONS

Japanese Office Action issued in corresponding Japanese Patent Application No. 2023-091076, dated Jul. 9, 2024, in 5 pages.

Mar. 22, 2023 First OA from Chinese App. No. 202211206312.9 (11 pgs).

Tian et al, "Nucleotide-dependent conformational changes of tubulin intra-dimer and inter-dimer during tubulin assembly", The [th] National Symposium of Cryo-EM and Structural Biology (NSCEM2021), p. 94, Sep. 24, 2021.

Arnold et al, "Specific Cryo-focused Ion Beam Sample Preparation Guided by 3D Correlative Microscopy", Biophysical Journal, p. 860-869, Feb. 29, 2016.

Gorelick et al, "PIE-scope, integrated cryo-correlative light and FIB/SEM microscopy", eLife, p. 1-15, Jul. 1, 2019.

Tian et al., "Cryogenic superresolution correlative light and electron microscopy on the frontier of subcellular imaging", Biophysical Reviews, vol. 13, 2021, pp. 1163-1171.

Extended European Search Report of corresponding European Patent Application No. 23179360.5 issued on Feb. 13, 2024 in 8 pages.

Office Action of corresponding Japanese Patent Application No. 2023-091076 issued on Mar. 12, 2024 in 8 pages.

* cited by examiner

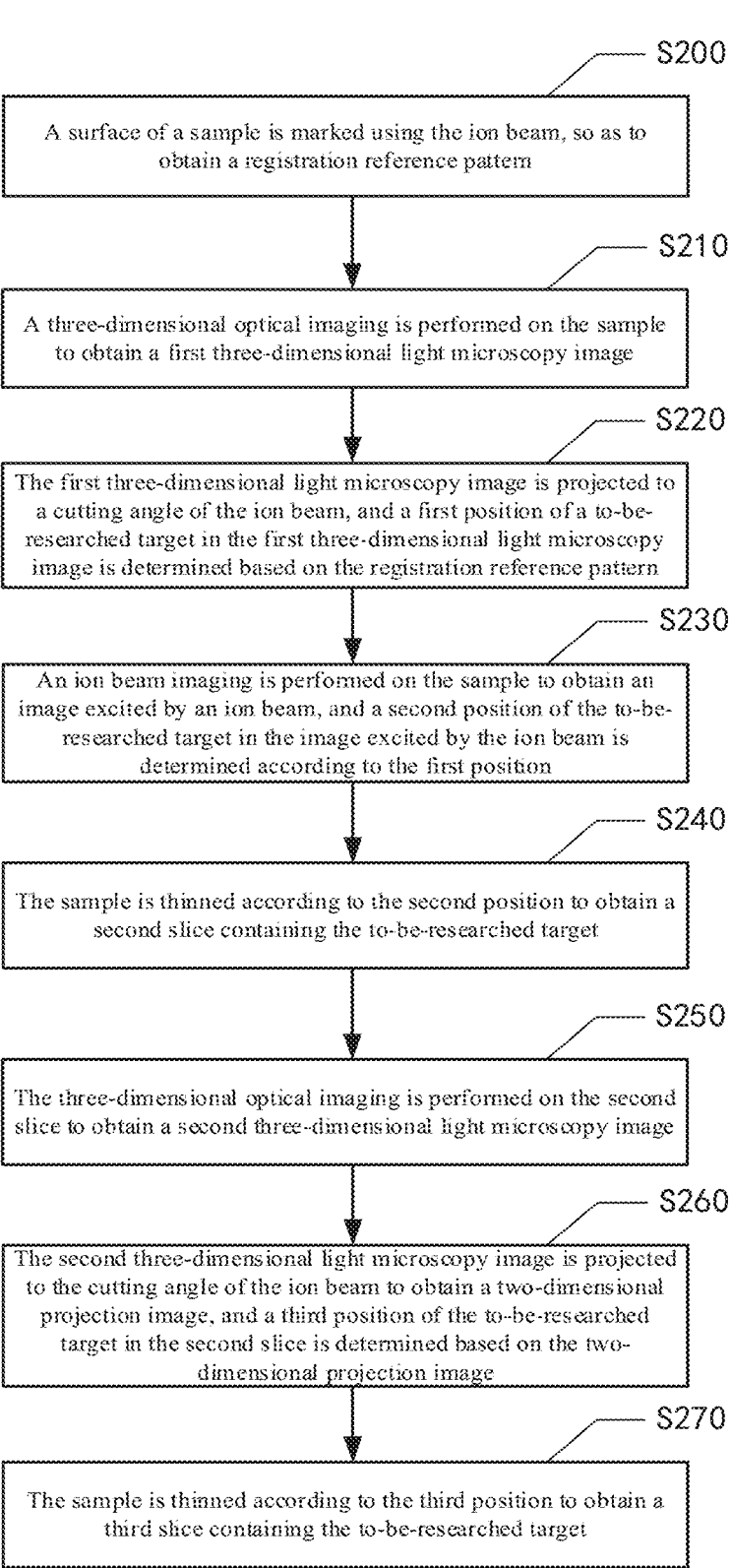

S200

A surface of a sample is marked using the ion beam, so as to obtain a registration reference pattern

S210

A three-dimensional optical imaging is performed on the sample to obtain a first three-dimensional light microscopy image

S220

The first three-dimensional light microscopy image is projected to a cutting angle of the ion beam, and a first position of a to-be-researched target in the first three-dimensional light microscopy image is determined based on the registration reference pattern

S230

An ion beam imaging is performed on the sample to obtain an image excited by an ion beam, and a second position of the to-be-researched target in the image excited by the ion beam is determined according to the first position

S240

The sample is thinned according to the second position to obtain a second slice containing the to-be-researched target

S250

The three-dimensional optical imaging is performed on the second slice to obtain a second three-dimensional light microscopy image

S260

The second three-dimensional light microscopy image is projected to the cutting angle of the ion beam to obtain a two-dimensional projection image, and a third position of the to-be-researched target in the second slice is determined based on the two-dimensional projection image

S270

The sample is thinned according to the third position to obtain a third slice containing the to-be-researched target

FIG. 2

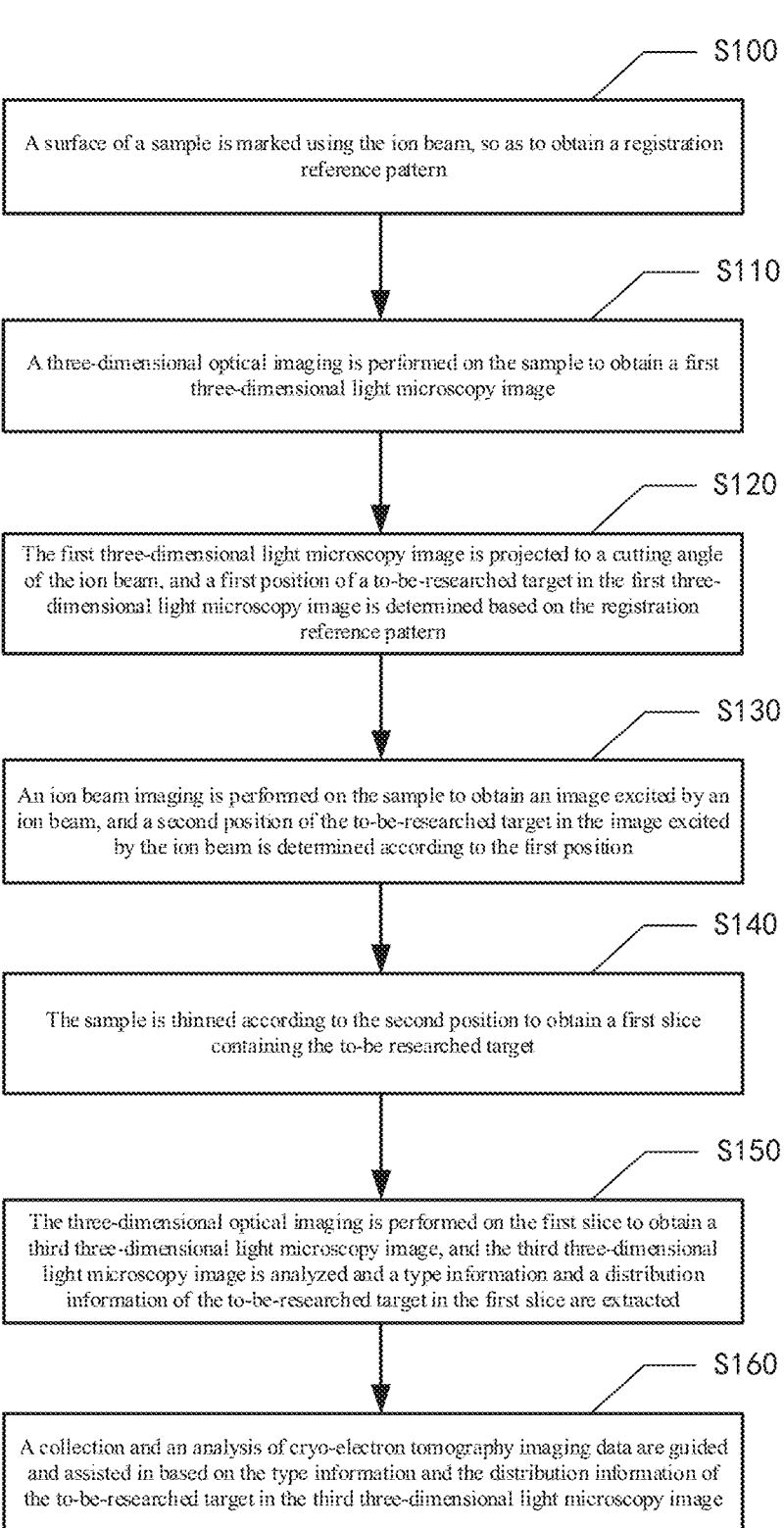

S100

A surface of a sample is marked using the ion beam, so as to obtain a registration reference pattern

S110

A three-dimensional optical imaging is performed on the sample to obtain a first three-dimensional light microscopy image

S120

The first three-dimensional light microscopy image is projected to a cutting angle of the ion beam, and a first position of a to-be-researched target in the first three-dimensional light microscopy image is determined based on the registration reference pattern

S130

An ion beam imaging is performed on the sample to obtain an image excited by an ion beam, and a second position of the to-be-researched target in the image excited by the ion beam is determined according to the first position

S140

The sample is thinned according to the second position to obtain a first slice containing the to-be researched target

S150

The three-dimensional optical imaging is performed on the first slice to obtain a third three-dimensional light microscopy image, and the third three-dimensional light microscopy image is analyzed and a type information and a distribution information of the to-be-researched target in the first slice are extracted

S160

A collection and an analysis of cryo-electron tomography imaging data are guided and assisted in based on the type information and the distribution information of the to-be-researched target in the third three-dimensional light microscopy image

FIG. 4

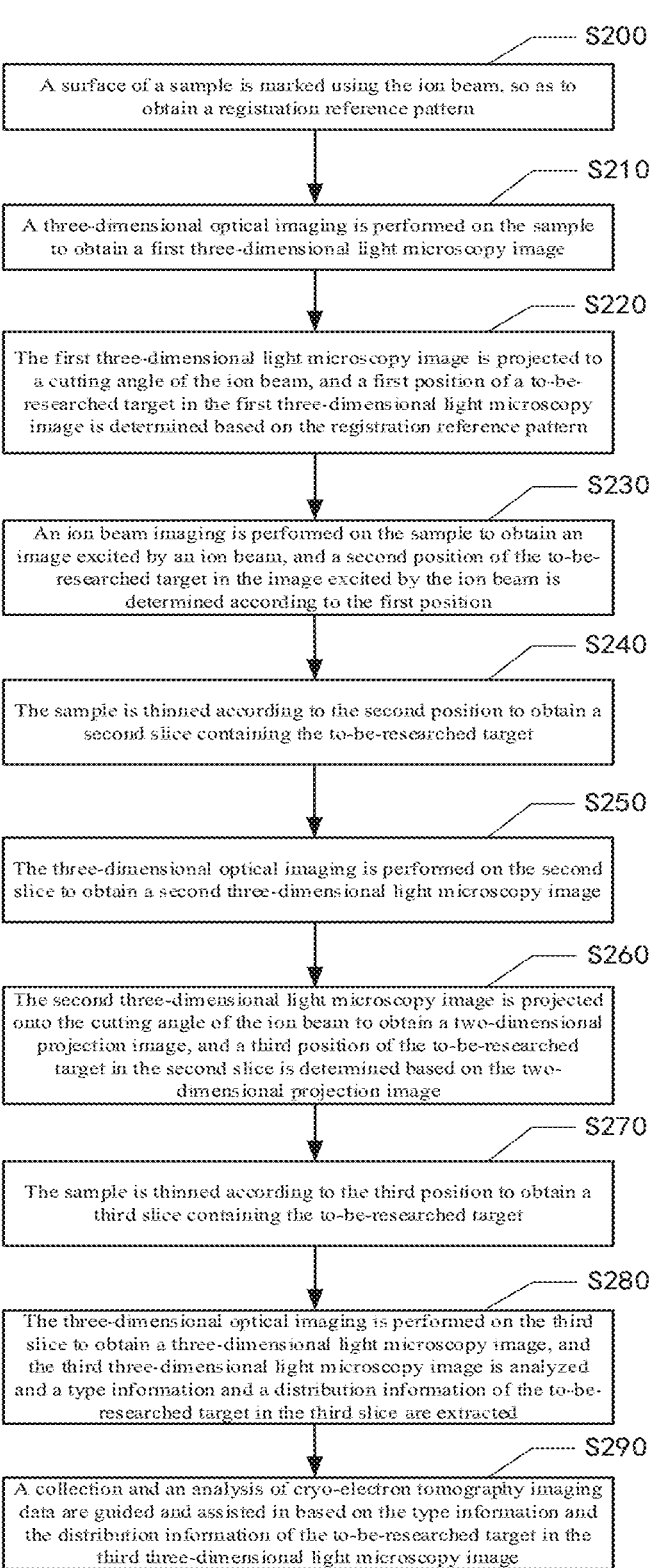

S200
A surface of a sample is marked using the ion beam, so as to obtain a registration reference pattern S210
A three-dimensional optical imaging is performed on the sample to obtain a first three-dimensional light microscopy image S220
The first three-dimensional light microscopy image is projected to a cutting angle of the ion beam, and a first position of a to-be-researched target in the first three-dimensional light microscopy image is determined based on the registration reference pattern S230
An ion beam imaging is performed on the sample to obtain an image excited by an ion beam, and a second position of the to-be-researched target in the image excited by the ion beam is determined according to the first position S240
The sample is thinned according to the second position to obtain a second slice containing the to-be-researched target S250
The three-dimensional optical imaging is performed on the second slice to obtain a second three-dimensional light microscopy image S260
The second three-dimensional light microscopy image is projected onto the cutting angle of the ion beam to obtain a two-dimensional projection image, and a third position of the to-be-researched target in the second slice is determined based on the two-dimensional projection image S270
The sample is thinned according to the third position to obtain a third slice containing the to-be-researched target S280
The three-dimensional optical imaging is performed on the third slice to obtain a three-dimensional light microscopy image, and the third three-dimensional light microscopy image is analyzed and a type information and a distribution information of the to-be-researched target in the third slice are extracted S290
A collection and an analysis of cryo-electron tomography imaging data are guided and assisted in based on the type information and the distribution information of the to-be-researched target in the third three-dimensional light microscopy image

FIG. 5

METHOD OF PROCESSING ION BEAM BASED ON OPTICAL MICROSCOPY IMAGING

CROSS-REFERENCE TO RELATED APPLICATION

This application claims the priority of Chinese Patent Application No. 202211206312.9 filed on Sep. 30, 2022 in the China National Intellectual Property Administration, the content of which is incorporated herein by reference in entirety.

TECHNICAL FIELD

The present disclosure relates to a field of optical microscopy imaging, ion beam processing, scanning electron microscopy imaging, and electron tomography three-dimensional reconstruction imaging technologies, and in particular, to a method of ion beam processing based on optical microscopy imaging.

BACKGROUND

A cryo-electron tomography (Cryo ET) three-dimensional reconstruction imaging technology is a cutting-edge technology for studying an in situ biological structure. The technology may fix cells and tissues in amorphous ice in a nearly natural physiological state through rapid freezing or high-pressure freezing, and then freeze and thin a sample, and then perform a cryo-ET imaging on an ultra-thin slice, so that a high-precision in situ three-dimensional structure of the sample may be obtained through an image reconstruction. Due to a priority given to an electron penetration depth in the cryo-ET imaging, an important prerequisite for conducting a cryo-ET experiment is to thin the sample to a thin sheet having a thickness of several hundred nanometers.

Ion beam cutting is a technology derived from semiconductor processing, which was first applied by Marko et al. in 2006 to a thinning of a cryobiological sample. The technology may bombard a surface of the sample using high-energy particles (which are usually gallium ions, helium ions, xenon ions, neon ions, oxygen ions, argon examples, etc.), and remove unnecessary parts to achieve thinning, which may avoid a sample damage in a traditional slice. A cut thin sheet is very flat, and gradually becomes a mainstream thinning method for preparing a cryo-ET sample. However, there is an important flaw in a process of ion beam thinning. That is, an electronic imaging of the sample using an ion beam may only outline a superficial morphology information of the sample, but may not identify a type of the sample and a research target embedded inside the sample. As a result, the thinning process is usually "blind cutting", making it difficult to ensure that a processed slice contains a to-be-researched target of interest, and therefore may not perform an accurate "fixed-point" thinning on a specific research target.

An optical microscopy imaging, especially a fluorescence microscopy imaging, is an important means of life science research. Three-dimensional fluorescence imaging technologies, such as a confocal microscopy, a structured illumination microscopy, a light sheet microscopy, a three-dimensional single molecule localization microscopy, etc., have resolutions of 100 to tens of nanometers, and may perform a nanoscale imaging on a fluorescently marked organelle and a subcellular structure, so that various important information such as a type of a research target and a location, a distribution, etc. thereof in a three-dimensional space may be obtained.

In recent years, a correlative light and electron microscopy technology, which may combine an optical microscopy with an electron microscopy, is used to guide an ion beam cutting. The optical microscopy imaging may identify and locate the research target in the sample. A position of the research target in the electron microscopy image may be located by matching a light microscopy image with an electron microscopy image, so that a cutting site of the ion beam may be determined. The core of the technology is a high-precision registration of an optoelectronic image. A current mainstream registration method is to add a fiducial marker to the sample, or register the light microscopy image and the electron microscopy image through a coordinate transformation by using a natural special structure in the sample as a registration reference. The method may be affected by a reference point selection and a coordinate conversion error. The method may thus have a low accuracy and a poor repeatability, and usually may not meet positioning and cutting of a nanoscale organelle. In addition, a sample preparation process of adding the fiducial marker to the sample may increase a complexity of the experiment.

In summary, an existing workflow of using a photoelectric correlation technology to guide the ion beam cutting has the following disadvantages: firstly, the sample preparation process of adding the fiducial marker to the sample is complex. Secondly, performing a photoelectric image registration using the coordinate transformation of the fiducial marker has a great error, and registration results obtained by selecting different reference points are different, which may have a poor repeatability and may be difficult to locate and cut the nanoscale organelle.

SUMMARY

For existing technical problems, the present disclosure provides a method of ion beam processing based on optical microscopy imaging, in order to at least partially solve the above-mentioned technical problems.

The present disclosure provides a method of ion beam processing based on optical microscopy imaging, including: marking a surface of a sample using an ion beam, so as to obtain a registration reference pattern; performing a three-dimensional optical imaging on the sample to obtain a first three-dimensional light microscopy image; projecting the first three-dimensional light microscopy image to a cutting angle of the ion beam, and determining a first position of a to-be-researched target in the first three-dimensional light microscopy image based on the registration reference pattern; performing an ion beam imaging on the sample to obtain an image excited by the ion beam, and determining, according to the first position, a second position of the to-be-researched target in the image excited by the ion beam; and thinning the sample according to the second position to obtain a first slice containing the to-be-researched target.

According to embodiments of the present disclosure, the method further includes: thinning the sample according to the second position to obtain a second slice containing the to-be-researched target; performing a three-dimensional optical imaging on the second slice to obtain a second three-dimensional light microscopy image, wherein a magnification of the three-dimensional optical imaging on the second slice is greater than a magnification of the three-dimensional optical imaging on the sample; projecting the second three-dimensional light microscopy image to the cutting angle of the ion beam to obtain a two-dimensional projection image; determining a third position of the to-be-researched target in the second slice based on the two-dimensional projection image; and thinning the sample according to the third position to obtain a third slice containing the to-be-researched target.

According to embodiments of the present disclosure, the performing a three-dimensional optical imaging on the sample or the performing a three-dimensional optical imaging on the second slice includes: loading the sample or the second slice onto a light microscopy imaging position in an electron microscopy vacuum chamber, so as to keep the sample horizontal; and performing, in a direction perpendicular to the sample, a multi-channel three-dimensional imaging on the sample or the second slice by using a three-dimensional optical imaging technology.

According to embodiments of the present disclosure, the three-dimensional optical imaging technology includes a confocal imaging method or a structured light illumination imaging method or a three-dimensional single molecule localization imaging method or a light sheet imaging method.

According to embodiments of the present disclosure, an image of the registration reference pattern is obtained using a bright field imaging, and an image of the to-be-researched target is obtained using a fluorescence imaging.

According to embodiments of the present disclosure, the projecting the first three-dimensional light microscopy image to a cutting angle of the ion beam or the projecting the second three-dimensional light microscopy image to the cutting angle of the ion beam to obtain a two-dimensional projection image includes: projecting the first three-dimensional light microscopy image and the second three-dimensional light microscopy image to the two-dimensional projection image with a same viewing angle as the ion beam.

According to embodiments of the present disclosure, the determining a first position of a to-be-researched target in the first three-dimensional light microscopy image based on the registration reference pattern includes: measuring a two-dimensional pixel distance from the to-be-researched target in the two-dimensional projection image to a center of the registration reference pattern; converting the two-dimensional pixel distance to a true distance based on a pre-calibrated optical imaging pixel point size; and determining the first position based on the true distance.

According to embodiments of the present disclosure, a thickness of the first slice and a thickness of the third slice are at a level of one hundred nanometers, the first slice and the third slice are suitable for a transmission electron imaging or an electron tomography imaging, and a thickness of the second slice is at a level of micrometers.

According to embodiments of the present disclosure, the method further includes: performing the three-dimensional optical imaging on the first slice or the third slice to obtain a third three-dimensional light microscopy image; analyzing the third three-dimensional light microscopy image and extracting a type information and a distribution information of the to-be-researched target in the first slice or the third slice; and guiding and assisting in a collection and an analysis of cryo-electron tomography imaging data based on the type information and the distribution information of the to-be-researched target.

According to embodiments of the present disclosure, the guiding and assisting in a collection and an analysis of cryo-electron tomography imaging data based on the type information and the distribution information of the to-be-researched target includes: performing a transmission electron imaging on the first slice or the third slice to obtain a transmission electron microscopy image; locating a fourth position of the to-be-researched target in the transmission electron microscopy image based on the type information and the distribution information of the to-be-researched target in the third three-dimensional light microscopy image; delineating a collection range of the cryo-electron tomography imaging data in the transmission electron microscopy image based on the fourth position; and associating a three-dimensional reconstructed cryo-electron tomography image with the corresponding third three-dimensional light microscopy image of the first slice or the third slice, and distinguishing a type and a position of the researched target using a fluorescence information, so as to assist in an analysis of a cryo-electron tomography image.

BRIEF DESCRIPTION OF THE DRAWINGS

FIG. 2 schematically shows a flowchart of a method of ion beam processing based on optical microscopy imaging provided by another embodiment of the present disclosure;

FIG. 4 schematically shows a flowchart of a method of ion beam processing based on optical microscopy imaging and a method of assisting a cryo-electron tomography imaging using an optical microscopy imaging provided by yet another embodiment of the present disclosure;

FIG. 5 schematically shows a flowchart of a method of ion beam processing based on optical microscopy imaging and a method of assisting a cryo-electron tomography imaging using an optical microscopy imaging provided by yet another embodiment of the present disclosure;

DESCRIPTION OF SYMBOLS

Figure 1:
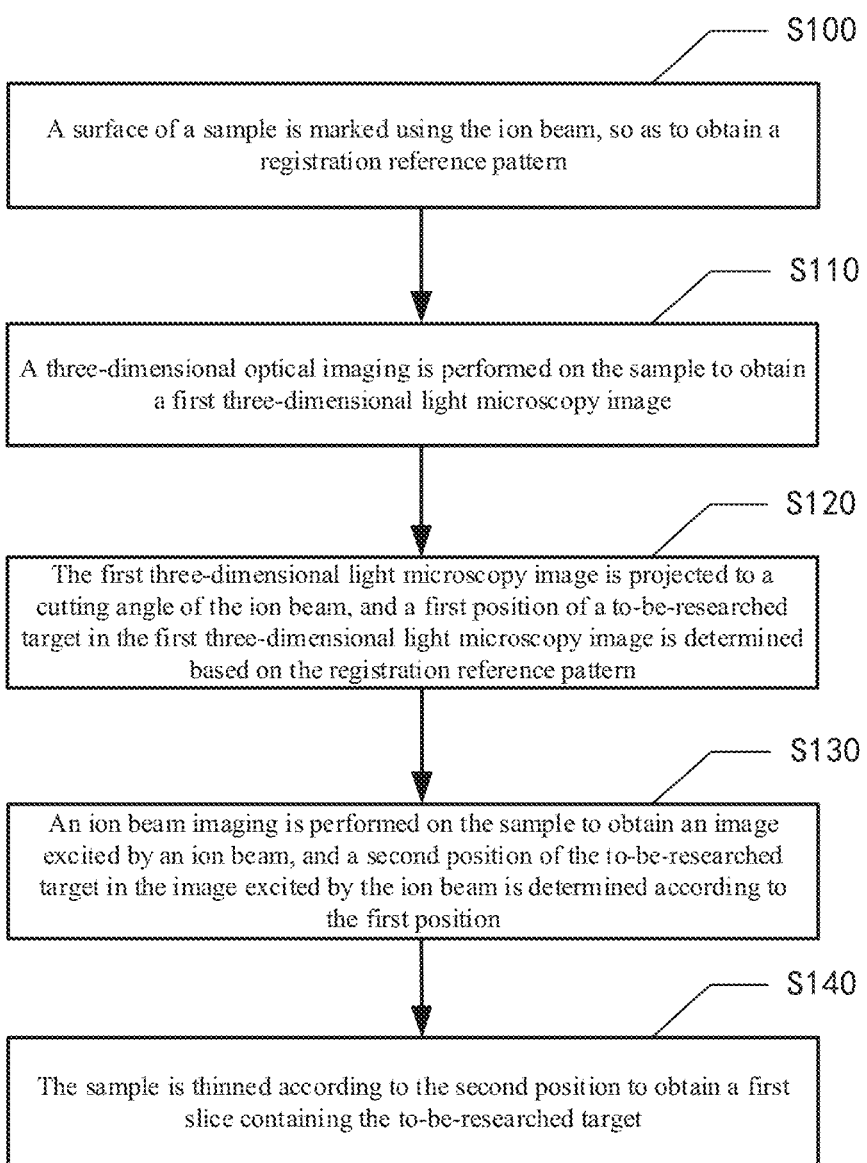
FIG. 1 schematically shows a flowchart of a method of ion beam processing based on optical microscopy imaging provided by an embodiment of the present disclosure.

1—ion beam module; 2—scanning electron microscopy module; 3—optical objective module; 4—optical window; 5—optical excitation imaging module; 6—electron microscopy imaging cutting position; 7—light microscopy imaging position; 8—vacuum chamber.

DETAILED DESCRIPTION OF EMBODIMENTS

In order to make objectives, technical solutions and advantages of the present disclosure clearer, the present disclosure will be further described in details below with reference to specific embodiments and accompanying drawings. Obviously, the described embodiments are some, but not all of embodiments of the present disclosure. Based on embodiments in the present disclosure, all other embodiments obtained by those skilled in the art without any creative work fall within the scope of protection of the present disclosure.

Terms used herein are only intended to describe specific embodiments and are not intended to limit the present disclosure. Terms "include", "comprise", "contain", etc. used herein indicate the presence of the described features, steps, operations and/or components, but do not exclude the presence or addition of one or more other features, steps, operations and/or components.

In the present disclosure, unless otherwise specified and limited, terms "installation", "coupling", "connection", "fixation", etc. should be broadly understood, for example, they may include a fixed connection, a detachable connection, or an integration; they may include a mechanical connection, an electrical connection or a communication with each other; they may include a direct connection or an indirect connection through an intermediate medium, which may be an internal connection between two components or an interaction relationship between two components. For those skilled in the art, specific meanings of the above-mentioned terms in the present disclosure may be understood based on specific circumstances.

In the descriptions of the present disclosure, it should be understood that orientation or positional relationships indicated by terms "longitudinal", "length", "circumferential", "front", "back", "left", "right", "top", "bottom", "inside", "outside", etc. are orientation or positional relationships shown in the accompanying drawings, which is only for convenience of describing the present disclosure and simplifying the description, and does not indicate or imply that the subsystem or component referred to must have a particular orientation or be constructed and operated in a particular orientation. Therefore, the above-mentioned terms may not be construed as limiting the present disclosure.

Throughout the accompanying drawings, the same elements are indicated by the same or similar reference numerals. When it may cause confusion in the understanding of the present disclosure, conventional structures or configurations may be omitted. The shapes, sizes, and positional relationships of components in the drawings do not reflect actual size, ratios, and actual positional relationships.

Similarly, in order to simplify the present disclosure and help understand one or more aspects in the present disclosure, in the above-mentioned descriptions of exemplary embodiments of the present disclosure, various features of the present disclosure are sometimes grouped together into a single embodiment, drawing, or description thereof. The descriptions of reference terms "an embodiment", "some embodiments", "an example", "a specific example", or "some examples" mean that specific features, structures, materials, or characteristics described in combination with the embodiment(s) or example(s) are included in at least one embodiment or example of the present disclosure. In the specification, schematic expressions of the above-mentioned terms do not necessarily refer to the same embodiment(s) or example(s). Moreover, the described specific features, structures, materials, or characteristics may be combined in an appropriate manner in any one or more embodiments or examples.

In addition, terms "first" and "second" are only used to describe the purpose, and may not be construed as indicating or implying relative importance or implying a quantity of technical features indicated. Therefore, features limited by "first" and "second" may explicitly or implicitly include one or more of the features. In the descriptions of the present disclosure, "multiple" means at least two, such as two, three, etc., unless otherwise specifically defined.

FIG. 1 schematically shows a flowchart of a method of ion beam processing based on optical microscopy imaging provided by an embodiment of the present disclosure.

As shown in FIG. 1, the method of processing the ion beam based on the optical microscopy imaging may include, for example, operations S100 to S140.

In operation S100, a surface of a sample is marked using an ion beam, so as to obtain a registration reference pattern.

In an embodiment of the present disclosure, the sample may be pre-loaded onto an electron microscopy imaging position in an electron microscopy chamber and tilted to a cutting angle, and then the surface of the sample may be marked using the ion beam, so as to obtain the registration reference pattern. For example, the means of marking may be etching. The ion beam may be a focused ion beam, a plasma beam, or a sub ion beam, etc. A specific type of the ion beam may be selected according to actual requirements, which will not be limited in the present disclosure. The cutting angle may be any value allowed by an electron microscopy system and may be set according to actual application requirements, which will not be limited in the present disclosure.

In embodiments of the present disclosure, a shape of the registration reference pattern may be a variety of shapes, as long as the shape may effectively function as a reference, which will not be limited in the present disclosure.

Figure 3A:
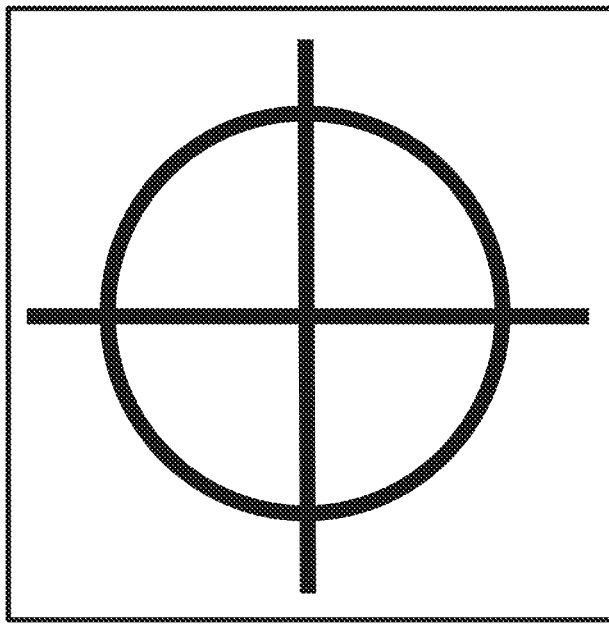
FIG. 3A to FIG. 3F schematically show images corresponding to operations performed by a method of ion beam processing based on optical microscopy imaging provided by embodiments of the present disclosure.

FIG. 3A schematically shows an image after marking a surface of a sample provided by embodiments of the present disclosure.

As shown in FIG. 3A, the registration reference pattern is etched into a "cross" shape, and the "cross"-shaped registration reference pattern may effectively serve as a reference.

In operation S1101, a three-dimensional optical imaging is performed on the sample to obtain a first three-dimensional light microscopy image.

In an embodiment of the present disclosure, first, the sample loaded in an electron microscopy vacuum chamber is placed at a light microscopy imaging position to keep the sample horizontal. Then, in a direction perpendicular to the sample, a multi-channel three-dimensional imaging is performed by using a three-dimensional optical imaging technology, and an imaging area covers an etched registration reference pattern and a to-be-researched target.

Figure 3B:
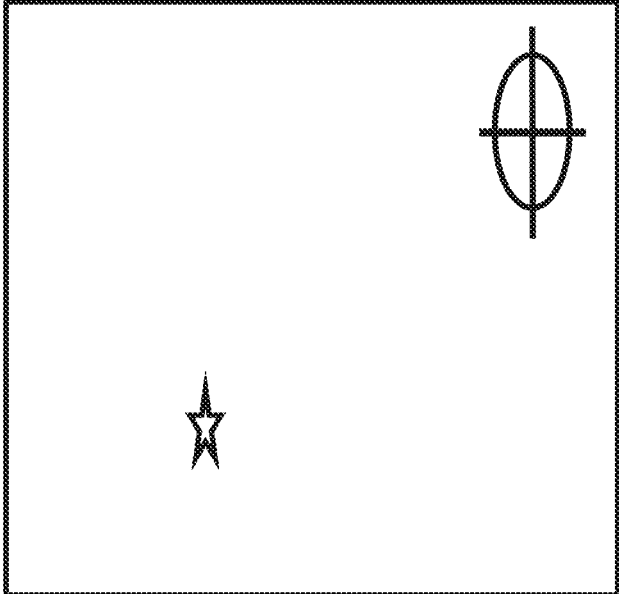

FIG. 3B schematically shows an image after performing a three-dimensional optical imaging on a sample provided by embodiments of the present disclosure.

As shown in FIG. 3B, a shape of pentagram represents the to-be-researched target. Since the sample may be marked using the ion beam so as to obtain the "cross"-shaped registration reference pattern, a position range of the to-be-researched target may be determined according to the "cross"-shaped registration reference pattern.

It should be understood that the three-dimensional optical imaging technology may be any optical imaging technology that may achieve three-dimensional imaging.

In an embodiment of the present disclosure, the three-dimensional optical imaging technology may include a confocal imaging method or a structured light illumination imaging method or a three-dimensional single molecule localization imaging method or a light sheet imaging method. For example, in a process of the three-dimensional imaging, a bright field and a fluorescence signal obtained by scanning different layers of the sample may be detected based on an embedded confocal microscope. An image of the registration reference pattern may be obtained using a bright field imaging, and an image of the to-be-researched target may be obtained using a fluorescence imaging.

In operation S1201, the first three-dimensional light microscopy image is projected to a cutting angle of the ion beam, and a first position of a to-be-researched target in the first three-dimensional light microscopy image is determined based on the registration reference pattern.

In embodiments of the present disclosure, the first three-dimensional light microscopy image taken in the direction perpendicular to the sample may be projected to a cutting angle of the ion beam to obtain a two-dimensional projection image with a same viewing angle as the ion beam.

Figure 3C:
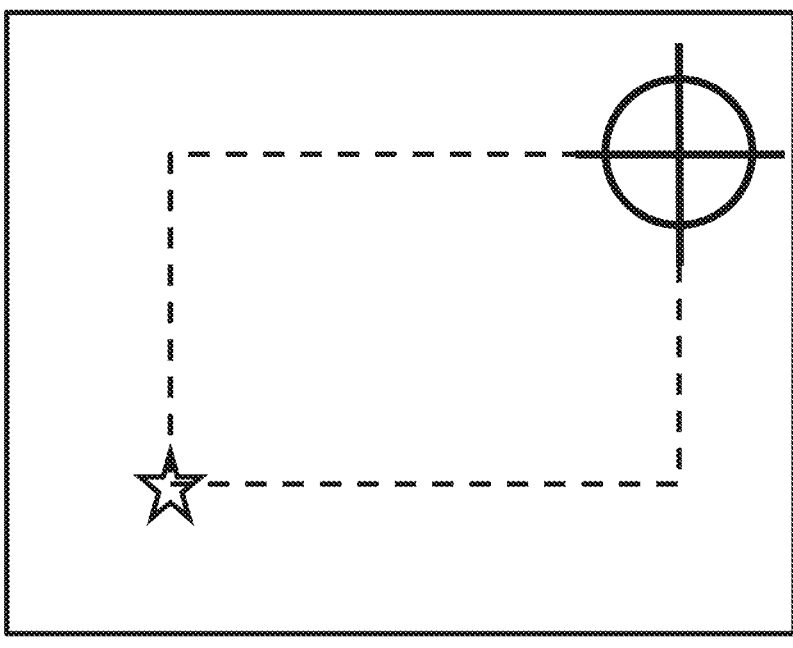

FIG. 3C schematically shows a two-dimensional projection image after projecting a first three-dimensional light microscopy image provided by embodiments of the present disclosure.

As shown in FIG. 3C, based on the two-dimensional projection image, the to-be-researched target may be selected in a fluorescence channel of the projection image, a two-dimensional pixel distance from a point position corresponding to the to-be-researched target to a center of the registration reference pattern may be measured, and the two-dimensional pixel distance may be converted to a true distance based on a pre-calibrated optical imaging pixel size.

In operation S1301, an ion beam imaging is performed on the sample to obtain an image excited by an ion beam, and a second position of the to-be-researched target in the image excited by the ion beam is determined according to the first position.

In an embodiment of the present disclosure, first, the sample loaded in the electron microscopy vacuum chamber is moved from the light microscopy imaging position to the electron microscopy imaging position, the sample is tilted to the cutting angle, and the ion beam imaging is performed on the sample. The imaging area covers the registration reference pattern and the researched target.

Figure 3D:
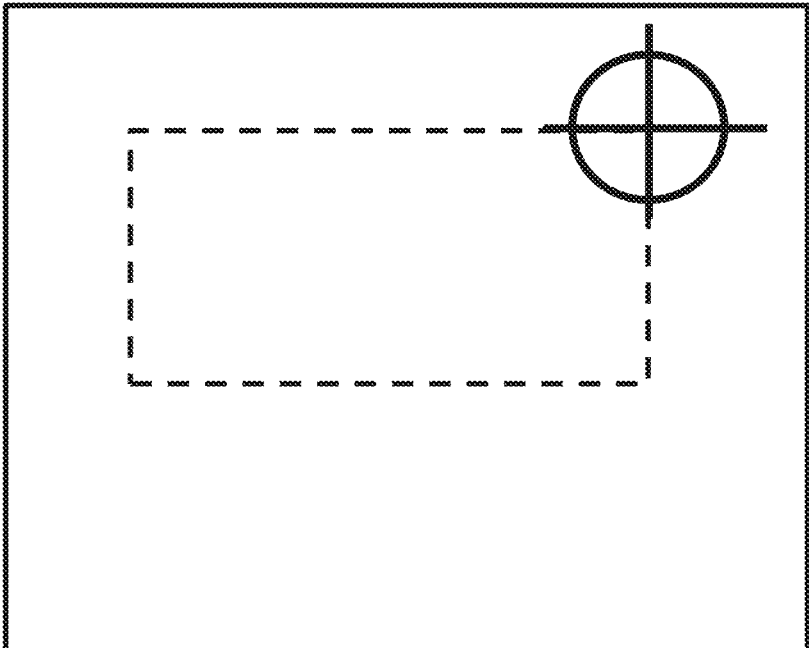

FIG. 3D schematically shows an image excited by a focused ion beam provided by embodiments of the present disclosure.

As shown in FIG. 3D, after obtaining an electron image excited by the focused ion beam, according to the distance from the target to the center of the reference pattern measured in operation S1201, a distance measurement function of an electron microscopy is used to measure the same distance in the electron image excited by the ion beam by taking a center of the same reference image as a base point, so that the second position of the target in the image excited by the ion beam may be determined.

In operation S140, the sample is thinned according to the second position to obtain a first slice containing the to-be-researched target.

In an embodiment of the present disclosure, the sample is tilted to the cutting angle, and the sample is thinned according to the second position of the to-be-researched target in the electron image excited by the ion beam determined in operation S130 to finally acquire the first slice containing the to-be-researched target. The first slice is suitable for a transmission electron imaging and an electron tomography imaging.

Figure 3E:
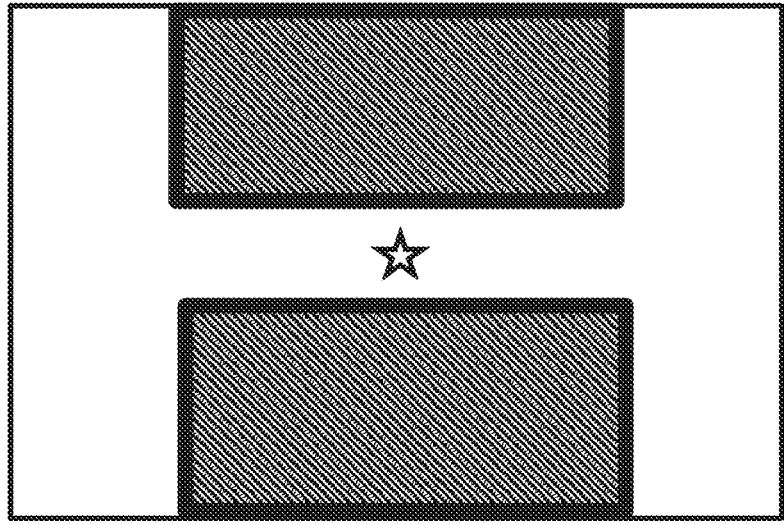

FIG. 3E schematically shows an image of a first slice provided by embodiments of the present disclosure.

As shown in FIG. 3E, a slice containing the to-be-researched target may be accurately obtained based on the above-mentioned operations.

According to embodiments of the present disclosure, a positioning accuracy of the method of processing the ion beam based on the optical microscopy imaging described in operations S100 to S140 is applicable to a research target with a larger size.

FIG. 2 schematically shows a flowchart of a method of ion beam processing based on optical microscopy imaging provided by another embodiment of the present disclosure.

As shown in FIG. 2, compared to the method of processing the ion beam shown in FIG. 1, the method of processing the ion beam based on the optical microscopy imaging uses a two-step positioning method, which may further improve the positioning accuracy. For example, the above-mentioned method may include operations S200 to S270. The operations S200 to S230 are the same as operations S100 to S130, and will not be repeated here.

In operation S240, the sample is thinned according to the second position to obtain a second slice containing the to-be-researched target.

In an embodiment of the present disclosure, the sample is tilted to the cutting angle, and the sample is thinned according to the second position of the to-be-researched target in the image excited by the ion beam determined in operation S230 to obtain the second slice containing the to-be-researched target. Operation S240 is a coarse thinning. Therefore, a thickness of the second slice may be at a level of micrometers for a subsequent further fine thinning.

Figure 3F:
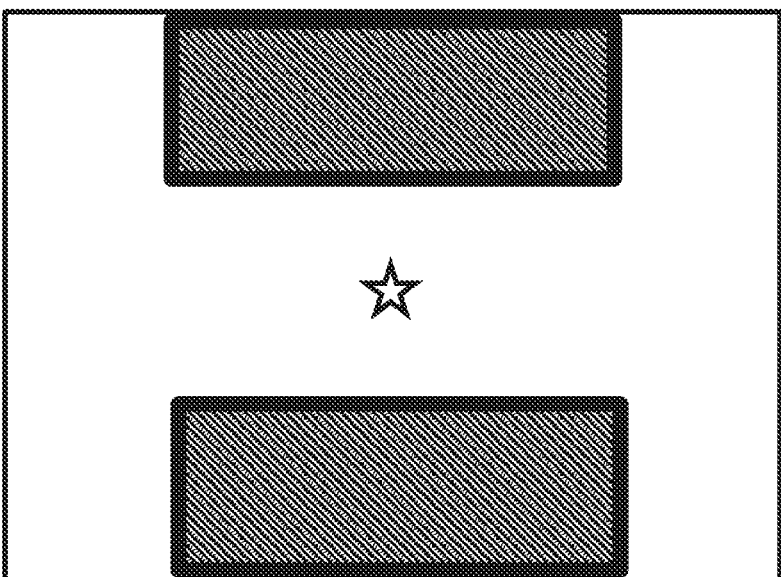

FIG. 3F schematically shows an image of a second slice provided by embodiments of the present disclosure.

As shown in FIG. 3F, compared to the image of the first slice shown in FIG. 3E, it can be clearly seen that operation S240 is the coarse thinning, and a thickness of the second slice thinned is much greater than a thickness of the first slice.

In operation S250, the three-dimensional optical imaging is performed on the second slice to obtain a second three-dimensional light microscopy image.

In an embodiment of the present disclosure, first, the second slice is loaded into the light microscopy imaging position in the electron microscopy vacuum chamber to keep the sample horizontal. Then, in the direction perpendicular to the sample, the multi-channel three-dimensional imaging is performed on the second slice using the three-dimensional optical imaging technology. A magnification of the three-dimensional optical imaging on the second slice may be greater than a magnification of the three-dimensional optical imaging on the sample. An imaging range does not need to include the registration reference pattern, so that the second slice may almost fill the imaging area, which may be beneficial to improve an imaging accuracy and an imaging speed.

In an embodiment of the present disclosure, the three-dimensional optical imaging technology may include a confocal imaging method or a structured light illumination imaging method or a three-dimensional single molecule localization imaging method or a light sheet imaging method. For example, in the process of the three-dimensional imaging, the bright field and the fluorescence signal obtained by scanning different layers of the sample may be detected based on the embedded confocal microscope. A surface morphology information of the slice may be obtained using the bright field imaging, and the image of the to-be-researched target may be obtained using the fluorescence imaging.

In operation S260, the second three-dimensional light microscopy image is projected to the cutting angle of the ion beam to obtain a two-dimensional projection image, and a third position of the to-be-researched target in the second slice is determined based on the two-dimensional projection image.

In an embodiment of the present disclosure, the two-dimensional projection image obtained by projecting the second three-dimensional light microscopy image to the cutting angle of the ion beam further contains a surface morphology information of the second slice obtained by the bright field imaging. The third position of the to-be-researched target in the second slice may be determined by an artificial recognition, an image fitting, etc. according to the surface morphology information of the second slice included in the two-dimensional projection image. A positioning accuracy of operation S260 is greater than the positioning accuracy of operation S1301, which may accurately locate nanoscale targets such as an organelle, a subcellular structure, etc.

In operation S270, the sample is thinned according to the third position to obtain a third slice containing the to-be-researched target.

In an embodiment of the present disclosure, the sample is tilted to the cutting angle, and the sample is thinned according to the third position of the to-be-researched target in the second slice determined by operation S260 to finally acquire the third slice containing the to-be-researched target. An image of the third slice obtained is similar to the image of the first slice shown in FIG. 3E. A thickness of the slice is at a level of nanometers, and is much less than the thickness of the second slice shown in FIG. 3F. The third slice is suitable for the transmission electron imaging and the electron tomography imaging.

According to embodiments of the present disclosure, the method of processing the ion beam based on the optical microscopic imaging described in operations S200 to S270 is applicable to research targets with a smaller size, such as an organelle, a subcellular structure and other nanoscale research targets.

FIG. 4 schematically shows a flowchart of a method of ion beam processing based on optical microscopy imaging provided by yet another embodiment of the present disclosure.

As shown in FIG. 4, the method of processing the ion beam based on the optical microscopy imaging further includes operations S150 to S160 on the basis of operations S100 to S140.

In operation S150, the three-dimensional optical imaging is performed on the first slice to obtain a third three-dimensional light microscopy image, and the third three-dimensional light microscopy image is analyzed and a type information and a distribution information of the to-be-researched target in the first slice are extracted.

In an embodiment of the present disclosure, the first slice is placed at a light microscopy imaging position in an electron microscopy vacuum chamber, and in a direction perpendicular to the sample, a three-dimensional multi-channel optical imaging may be performed on the first slice using a three-dimensional optical imaging technology so as to obtain information such as a type, a distribution, etc. of the to-be-researched target in the first slice. The three-dimensional optical imaging technology may include a confocal imaging method or a structured light illumination imaging method or a three-dimensional single molecule localization imaging method or a light sheet imaging method.

In operation S160, a collection and an analysis of cryo-electron tomography imaging data are guided and assisted in based on the type information and the distribution information of the to-be-researched target in the third three-dimensional light microscopy image.

In an embodiment of the present disclosure, the first slice is transferred to a transmission electron microscopy for a transmission electron imaging, and then a transmission electron microscopy image is associated with a corresponding third three-dimensional light microscopy image. That is, a fourth position of the researched target in the transmission electron microscopy image may be located through a light microscopy information. A collection range of the cryo-electron tomography imaging data may be delineated in the transmission electron microscopy image based on the fourth position. A three-dimensional reconstructed cryo-electron tomography image may also be associated with a corresponding third three-dimensional light microscopy image of the first slice, a type and a position of the researched target may be distinguished using a fluorescence information, so as to assist in an analysis of a cryo-electron tomography image.

FIG. 5 schematically shows a flowchart of a method of ion beam processing based on optical microscopy imaging provided by yet another embodiment of the present disclosure.

As shown in FIG. 5, the method of processing the ion beam based on the optical microscopy imaging further includes operations S280 to S290 on the basis of operations S200 to S270.

In operation S280, the three-dimensional optical imaging is performed on the third slice to obtain a third three-dimensional light microscopy image, and the third three-dimensional light microscopy image is analyzed and a type information and a distribution information of the to-be-researched target in the third slice are extracted.

In an embodiment of the present disclosure, the third slice is placed at the light microscopy imaging position in the electron microscopy vacuum chamber, and in the direction perpendicular to the sample, the three-dimensional multi-channel optical imaging is performed on the third slice using the three-dimensional optical imaging technology so as to obtain information such as a type, a distribution, etc. of the to-be-researched target in the third slice. The three-dimensional optical imaging technology may include a confocal imaging method or a structured light illumination imaging method or a three-dimensional single molecule localization imaging method or a light sheet imaging method.

In operation S290, a collection and an analysis of cryo-electron tomography imaging data are guided and assisted in based on the type information and the distribution information of the to-be-researched target in the third three-dimensional light microscopy image.

In an embodiment of the present disclosure, the third slice is transferred to a transmission electron microscopy for a transmission electron imaging, and then a transmission electron microscopy image is associated with a corresponding third three-dimensional light microscopy image. That is, a fourth position of the researched target in the transmission electron microscopy image may be located through a light microscopy information. A collection range of the cryo-electron tomography imaging data may be delineated in the transmission electron microscopy image based on the fourth position. A three-dimensional reconstructed cryo-electron tomography image may also be associated with a corresponding third three-dimensional light microscopy image of the first slice, a type and a position of the researched target may be distinguished using a fluorescence information, so as to assist in an analysis of a cryo-electron tomography image.

Figure 6:
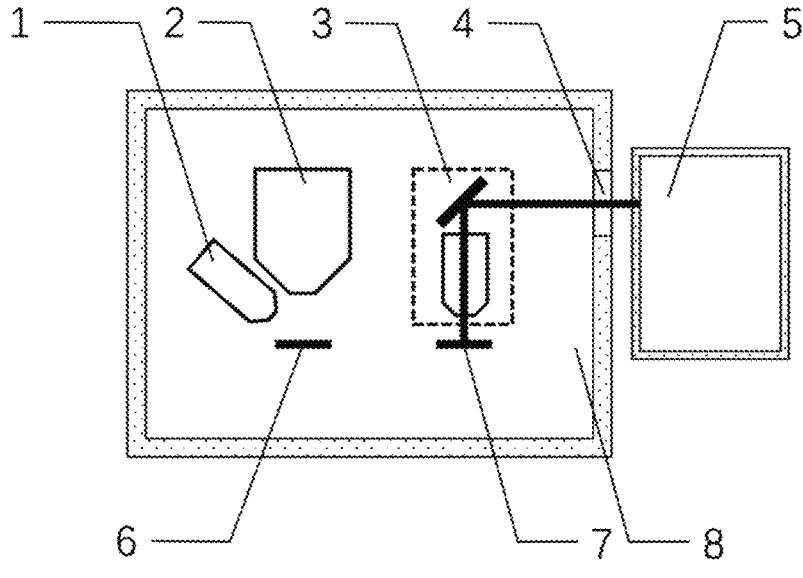
FIG. 6 schematically shows a structural diagram of an embedded three-dimensional optoelectronic correlation imaging apparatus for implementing the above-mentioned method of processing the ion beam provided by embodiments of the present disclosure.

FIG. 6 schematically shows a structural diagram of an embedded three-dimensional optoelectronic correlation imaging apparatus for implementing the above-mentioned method of processing the ion beam provided by embodiments of the present disclosure.

As shown in FIG. 6, the embedded three-dimensional optoelectronic correlation imaging apparatus may include:

an ion beam module 1, a scanning electron microscopy module 2, an optical objective module 3, an optical window 4, an optical excitation imaging module 5, an electron microscopy imaging cutting position 6, a light microscopy imaging position 7, and a vacuum chamber 8.

The ion beam module 1, the scanning electron microscopy module 2, and the optical objective module 3 may be provided inside the same vacuum chamber 8. The optical window 4 is provided on a sidewall of the vacuum chamber 8 and is in an optical path communication with the optical objective module 3 and the optical excitation imaging module 5. The electron microscopy imaging cutting position 6 is provided below the ion beam module 1 and the scanning electron microscopy module 2, and the light microscopy imaging position 7 is provided below the optical objective module 3. The sample may be switched between the electron microscopy imaging cutting position 6 and the light microscopy imaging position 7.

The ion beam module 1 is used for an ion beam cutting of the sample, the scanning electron microscopy module 2 is used for a scanning electron microscopy imaging of the sample, the optical window 4 is used to be connected to optical paths inside and outside the vacuum chamber 8, the optical excitation imaging module 5 is used to provide scanning excitation light for confocal imaging, and transmit the excitation light to the sample through the optical objective module 3. A three-dimensional imaging may be achieved by scanning different layers of the sample. At the same time, the optical excitation imaging module 5 is also used to detect a bright field signal and a fluorescence signal collected by the optical objective module 3, and an image is collected by a computer.

It should be noted that the embedded three-dimensional optoelectronic correlation imaging apparatus of the above-mentioned structure is only a structure capable of implementing the method of processing the ion beam provided by embodiments of the present disclosure, and is not intended to limit the method of processing the ion beam provided by the present disclosure.

In summary, a registration process provided by embodiments of the present disclosure adopts a photoelectric correlation registration, which may directly etch the surface of the sample using the ion beam so as to acquire the registration reference pattern for registration without adding a fiducial marker, so that a complexity of an experiment may be reduced and an operation may be simple and have a high repeatability. The optoelectronic correlation registration may be performed using a three-dimensional light microscopy image projection and the registration reference pattern etched by the ion beam, which may further reduce the complexity and enhance a repeatability of a registration result. Further, a position of a target in a slice may be determined using the three-dimensional light microscopy image projection, which may have a high positioning accuracy and may achieve fixed-point cutting with a nano precision. In addition, a type of the target may be identified and the position of the target in the slice may be determined by using the three-dimensional light microscopy image of a final slice. The information may be used to assist in the collection and the analysis of the cryo-electron tomography imaging data.

The method of processing the ion beam based on the optical microscopy imaging provided by embodiments of the present disclosure includes at least the following advantages:

A registration process adopts a photoelectric correlation registration, which may directly etch the surface of the sample using the ion beam so as to acquire the registration reference pattern for registration without adding a fiducial marker, so that a complexity of an experiment may be reduced and an operation may be simple and have a high repeatability. The optoelectronic correlation registration may be performed using a three-dimensional light microscopy image projection and the registration reference pattern etched by the ion beam, which may further reduce the complexity and enhance a repeatability of a registration result.

Further, a position of a target in a slice may be determined using the three-dimensional light microscopy image projection, which may have a high positioning accuracy and may achieve fixed-point cutting with a nano precision.

In addition, a type of the target may be identified and the position of the target in the slice may be determined by using the three-dimensional light microscopy image of a final slice. The information may be used to assist in the collection and the analysis of the cryo-electron tomography imaging data.

The above-mentioned specific embodiments have described in detail the objectives, technical solutions and advantages of the present disclosure. It should be noted that the above are only specific embodiments of the present disclosure and are not intended to limit the present disclosure. Any modifications, equivalent substitutions, improvements, and the like made within the spirit and scope of the present disclosure shall be included in the scope of protection of the present disclosure.

What is claimed is:

1. A method of ion beam processing based on optical microscopy imaging, comprising:

marking a surface of a sample using an ion beam, so as to obtain a registration reference pattern;

performing a three-dimensional optical imaging on the sample to obtain a first three-dimensional light microscopy image;

projecting the first three-dimensional light microscopy image to a cutting angle of the ion beam, and determining a first position of a to-be-researched target in the first three-dimensional light microscopy image based on the registration reference pattern; and performing an ion beam imaging on the sample to obtain an image excited by an ion beam, and determining, according to the first position, a second position of the to-be-researched target in the image excited by the ion beam, wherein the method further comprises:

thinning the sample according to the second position to obtain a second slice containing the to-be-researched target;

performing a three-dimensional optical imaging on the second slice to obtain a second three-dimensional light microscopy image, wherein a magnification of the three-dimensional optical imaging on the second slice is greater than a magnification of the three-dimensional optical imaging on the sample;

projecting the second three-dimensional light microscopy image to the cutting angle of the ion beam to obtain a two-dimensional projection image;

determining a third position of the to-be-researched target in the second slice based on the two-dimensional projection image; and thinning the sample according to the third position to obtain a third slice containing the to-be-researched target.

2. The method according to claim 1, further comprising:
thinning the sample according to the second position to obtain a first slice containing the to-be-researched target.

3. The method according to claim 1, wherein the performing a three-dimensional optical imaging on the sample or the performing a three-dimensional optical imaging on the second slice comprises:
loading the sample or the second slice onto a light microscopy imaging position in an electron microscopy vacuum chamber, so as to keep the sample horizontal; and
performing, in a direction perpendicular to the sample, a multi-channel three-dimensional imaging on the sample or the second slice by using a three-dimensional optical imaging technology.

4. The method according to claim 3, wherein the three-dimensional optical imaging technology comprises a confocal imaging method, a structured light illumination imaging method, a three-dimensional single molecule localization imaging method, or a light sheet imaging method.

5. The method according to claim 3, wherein an image of the registration reference pattern or a slice surface morphology information is obtained using a bright field imaging, and an image of the to-be-researched target is obtained using a fluorescence imaging.

6. The method according to claim 1, wherein the projecting the first three-dimensional light microscopy image to a cutting angle of the ion beam or the projecting the second three-dimensional light microscopy image to the cutting angle of the ion beam to obtain a two-dimensional projection image comprises:
projecting the first three-dimensional light microscopy image and the second three-dimensional light microscopy image to the two-dimensional projection image with a same viewing angle as the ion beam.

7. The method according to claim 6, wherein the determining a first position of a to-be-researched target in the first three-dimensional light microscopy image based on the registration reference pattern comprises:
measuring a two-dimensional pixel distance from the to-be-researched target in the two-dimensional projection image to a center of the registration reference pattern;
converting the two-dimensional pixel distance to a true distance based on a pre-calibrated optical imaging pixel point size; and
determining the first position based on the true distance.

8. The method according to claim 2, wherein a thickness of the first slice is at a level of one hundred nanometers, and the first slice is suitable for a transmission electron imaging or an electron tomography imaging.

9. The method according to claim 1, wherein a thickness of the third slice is at a level of one hundred nanometers, the third slice is suitable for a transmission electron imaging or an electron tomography imaging, and a thickness of the second slice is at a level of micrometers.

10. The method according to claim 2, further comprising:
performing the three-dimensional optical imaging on the first slice to obtain a third three-dimensional light microscopy image;

analyzing the third three-dimensional light microscopy image and extracting a type information and a distribution information of the to-be-researched target in the first slice; and
guiding and assisting in a collection and an analysis of cryo-electron tomography imaging data based on the type information and the distribution information of the to-be-researched target.

11. The method according to claim 10, wherein guiding and assisting in a collection and an analysis of cryo-electron tomography imaging data based on the type information and the distribution information of the to-be-researched target comprises:
performing a transmission electron imaging on the first slice to obtain a transmission electron microscopy image;
locating a fourth position of the to-be-researched target in the transmission electron microscopy image based on the type information and the distribution information of the to-be-researched target;
delineating a collection range of the cryo-electron tomography imaging data in the transmission electron microscopy image based on the fourth position; and
associating a three-dimensional reconstructed cryo-electron tomography image with a corresponding third three-dimensional light microscopy image of the first slice, and distinguishing a type and a position of the to-be-researched target using a fluorescence information, so as to assist in an analysis of a cryo-electron tomography image.

12. The method according to claim 1, further comprising:
performing the three-dimensional optical imaging on the third slice to obtain a third three-dimensional light microscopy image;
analyzing the third three-dimensional light microscopy image and extracting a type information and a distribution information of the to-be-researched target in the third slice; and
guiding and assisting in a collection and an analysis of cryo-electron tomography imaging data based on the type information and the distribution information of the to-be-researched target.

13. The method according to claim 12, wherein the guiding and assisting in a collection and an analysis of cryo-electron tomography imaging data based on the type information and the distribution information of the to-be-researched target comprises:
performing a transmission electron imaging on the third slice to obtain a transmission electron microscopy image;
locating a fourth position of the to-be-researched target in the transmission electron microscopy image based on the type information and the distribution information of the to-be-researched target;
delineating a collection range of the cryo-electron tomography imaging data in the transmission electron microscopy image based on the fourth position; and
associating a three-dimensional reconstructed cryo-electron tomography image with a corresponding third three-dimensional light microscopy image of the third slice, and distinguishing a type and a position of the to-be-researched target using a fluorescence information, so as to assist in an analysis of a cryo-electron tomography image.

* * * * *